(12) United States Patent
Yu et al.

(10) Patent No.: US 12,408,327 B2
(45) Date of Patent: Sep. 2, 2025

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventors: Yexiao Yu, Hefei (CN); Longyang Chen, Hefei (CN); Zhongming Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 436 days.

(21) Appl. No.: 18/161,124

(22) Filed: Jan. 30, 2023

(65) Prior Publication Data
US 2023/0180465 A1    Jun. 8, 2023

Related U.S. Application Data

(63) Continuation of application No. PCT/CN2022/070400, filed on Jan. 5, 2022.

(30) Foreign Application Priority Data

Nov. 8, 2021   (CN) .......................... 202111311525.3

(51) Int. Cl.
*H01L 21/311* (2006.01)
*H01L 21/308* (2006.01)
*H10B 12/00* (2023.01)

(52) U.S. Cl.
CPC ....... *H10B 12/482* (2023.02); *H01L 21/3086* (2013.01); *H01L 21/31144* (2013.01); *H10B 12/485* (2023.02)

(58) Field of Classification Search
CPC .......... H01L 21/3086; H01L 21/31144; H01L 21/0332; H01L 21/0335; H01L 21/3081
See application file for complete search history.

(56) References Cited

U.S. PATENT DOCUMENTS

| | | |
|---|---|---|
| 8,846,540 B2 | 9/2014 | Lee |
| 9,425,200 B2 | 8/2016 | Hwang |
| 10,411,014 B2 | 9/2019 | Hwang |

(Continued)

FOREIGN PATENT DOCUMENTS

| | | |
|---|---|---|
| CN | 101378034 A | 3/2009 |
| CN | 109872967 A | 6/2019 |

(Continued)

*Primary Examiner* — Walter H Swanson
(74) *Attorney, Agent, or Firm* — Syncoda LLC; Feng Ma

(57) ABSTRACT

Provided is a semiconductor structure and a method for manufacturing the same. The method includes forming a spin on hard mask layer on a base, active areas arranged at intervals in the base, bit lines arranged at intervals and extending in a first direction on the base, each bit line electrically connected to at least one active area, and the spin on hard mask layer filled between the bit lines and covering the bit lines; removing part of the spin on hard mask layer to form first trenches arranged at intervals and extending in a second direction; forming first sacrificial layers in the first trenches; removing the spin on hard mask layer between the first sacrificial layers to form second trenches; forming first supporting layers in the second trenches; removing the first sacrificial layers and elongating the first trenches located between adjacent bit lines to the active areas.

16 Claims, 25 Drawing Sheets

(56) References Cited

U.S. PATENT DOCUMENTS

| | | |
|---|---|---|
| 10,586,709 B2 | 3/2020 | Ko |
| 11,120,992 B2 | 9/2021 | Huh |
| 11,296,088 B2 | 4/2022 | Hwang |
| 2009/0061615 A1 | 3/2009 | Cho |
| 2014/0057442 A1 | 2/2014 | Lee et al. |
| 2015/0126013 A1 | 5/2015 | Hwang et al. |
| 2016/0329337 A1 | 11/2016 | Hwang et al. |
| 2019/0172717 A1 | 6/2019 | Ko et al. |
| 2019/0348418 A1 | 11/2019 | Hwang et al. |
| 2021/0124258 A1* | 4/2021 | Ahn .................... H01L 21/0274 |
| 2021/0143012 A1 | 5/2021 | Huh |

FOREIGN PATENT DOCUMENTS

| CN | 112786437 A | 5/2021 |
|---|---|---|
| CN | 113097144 A | 7/2021 |
| CN | 113517233 A | 10/2021 |

\* cited by examiner

SEMICONDUCTOR STRUCTURE AND METHOD FOR MANUFACTURING SAME

CROSS-REFERENCE TO RELATED APPLICATIONS

This application is a continuation application of International Application No. PCT/CN2022/070400, filed on Jan. 5, 2022, which claims priority to Chinese Patent Application No. 202111311525.3, filed on Nov. 8, 2021. The disclosures of International Application No. PCT/CN2022/070400 and Chinese Patent Application No. 202111311525.3 are hereby incorporated by reference in their entireties.

BACKGROUND

With the development of semiconductor technologies, the application of a semiconductor structure is more and more extensive. A dynamic random access memory (DRAM) has gradually become a semiconductor memory device commonly used in an electronic device. The dynamic random access memory includes a plurality of memory cells, and each of which includes a transistor and a capacitor. The capacitor is used for storing data information and the transistor is used for controlling the reading or writing of the data information in the capacitor. The gate of the transistor is electrically connected to a word line (WL), and the transistor is controlled to be turned on and off by the voltage applied on the word line. One of the source and the drain of the transistor is electrically connected to a bit line (BL), while the other one of the source and the drain is connected to the capacitor, and the data information is stored or outputted via the bit line.

In the related art, bit lines arranged at intervals and extending in a first direction are usually first formed on a base, and then first supporting layers are formed between adjacent bit lines, and the bit lines and the first supporting layers define filling holes. However, in the process of forming the filling holes, relatively more portion of each bit line far away from the base loses, which affects the performance of the bit line.

SUMMARY

The disclosure relates to the technical field of semiconductors, and in particular to a semiconductor structure and a method for manufacturing the same.

Embodiments of the disclosure provide a semiconductor structure and a method for manufacturing the same.

A first aspect of the embodiments of the disclosure provides a method for manufacturing a semiconductor structure, which includes: forming a spin on hard mask layer on a base, in which a plurality of active areas arranged at intervals are provided in the base, a plurality of bit lines arranged at intervals and extending in a first direction are provided on the base, each of the bit lines is electrically connected to at least one of the active areas, and the spin on hard mask layer is filled between the bit lines and covers the bit lines; removing part of the spin on hard mask layer to form a plurality of first trenches arranged at intervals and extending in a second direction; forming first sacrificial layers in the first trenches, in which the first sacrificial layers are filled in the first trenches; removing the spin on hard mask layer between the first sacrificial layers to form second trenches; forming first supporting layers in the second trenches, in which the first supporting layers are filled in the second trenches; and removing the first sacrificial layers and elongating the first trenches located between adjacent bit lines to the active areas.

A second aspect of the embodiments of the disclosure provides a semiconductor structure, which is obtained by the above-mentioned method, and thus has at least the advantage that the loss of a bit line is less.

DETAILED DESCRIPTION

In order to reduce the loss of a bit line during manufacturing a semiconductor structure, embodiments of the disclosure provide a method for manufacturing a semiconductor structure, in which a spin on hard mask layer filled between bit lines and covering the bit lines is formed, and by utilizing a high selectivity ratio between the spin on hard mask layer and the bit lines, the loss of a portion of a bit line is reduced during subsequent etching, thereby ensuring the performance of the bit line.

In order to make the above-mentioned objectives, features and advantages of embodiments of this disclosure more apparent and easy to be understood, the technical solutions in the embodiments of the disclosure will be clearly and completely described with reference to the drawings of the embodiments of this disclosure. Apparently, the described embodiments are only a part of embodiments of this application, not all of them. Based on the embodiments in this disclosure, any other embodiments obtained by an ordinary person skilled in the art without involving creative efforts are within the protection scope of the application.

Figure 1:
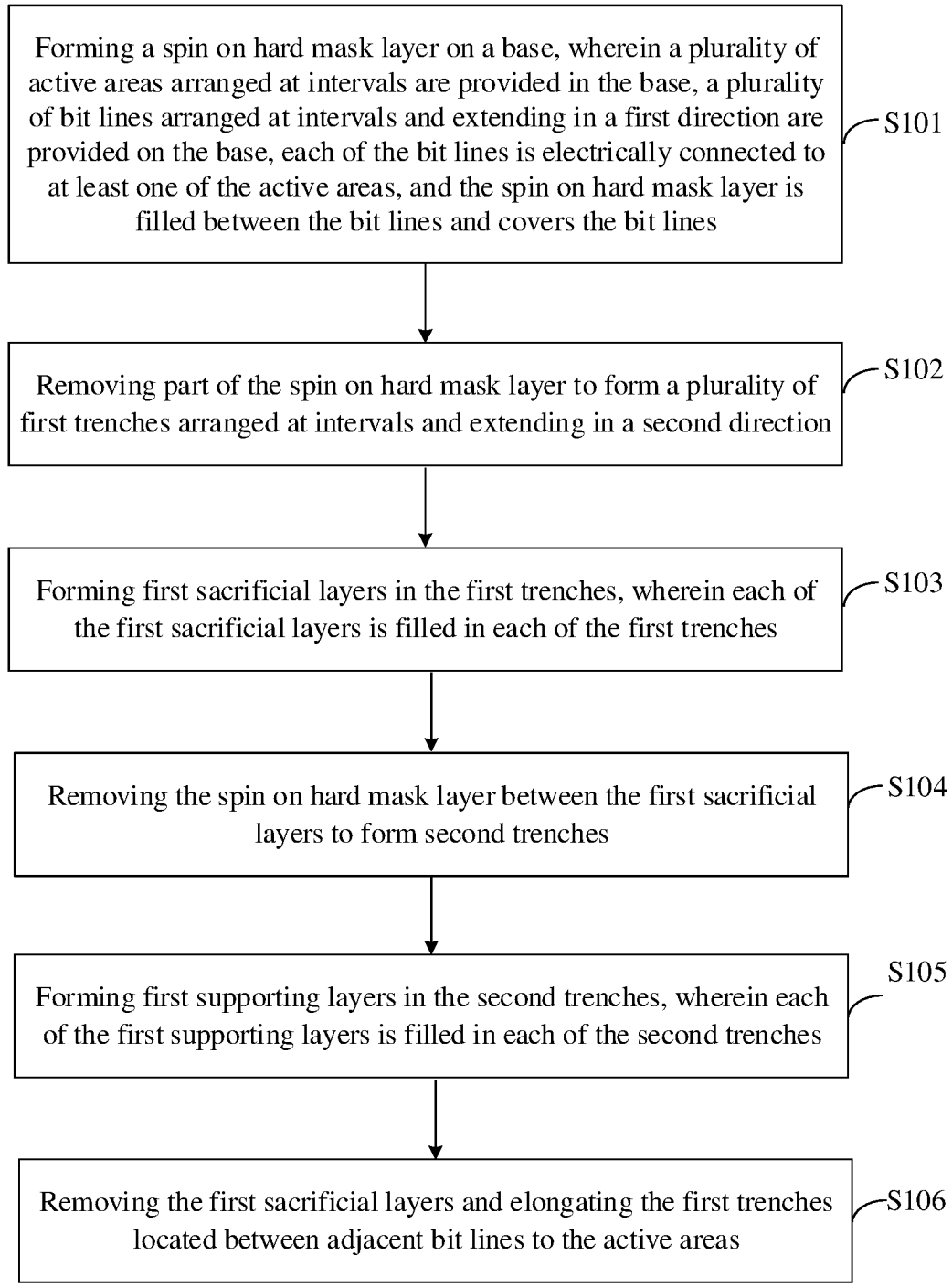
FIG. 1 is a flowchart of a method for manufacturing a semiconductor structure in an embodiment of the disclosure.

Referring to FIG. 1, embodiments of the disclosure provide a method for manufacturing a semiconductor structure, which at least includes the following operations.

At S101, a spin on hard mask layer is formed on a base. A plurality of active areas arranged at intervals are provided in the base, a plurality of bit lines arranged at intervals and extending in a first direction are provided on the base, each of the bit lines is electrically connected to at least one of the active areas, and the spin on hard mask layer is filled between the bit lines and covers the bit lines.

Figure 2:
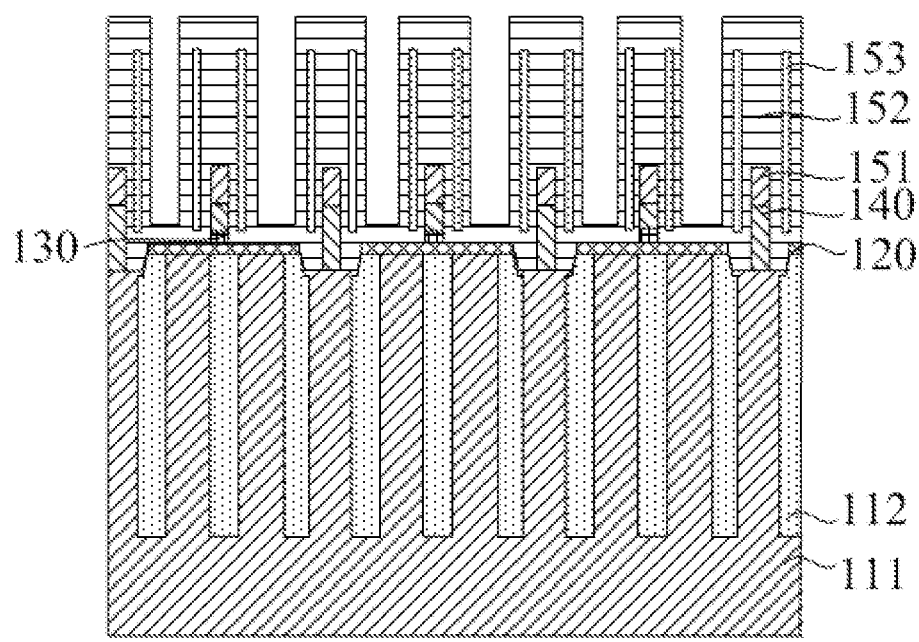
FIG. 2 is a schematic structural diagram of a base and bit lines in an embodiment of the disclosure.
Figure 3:
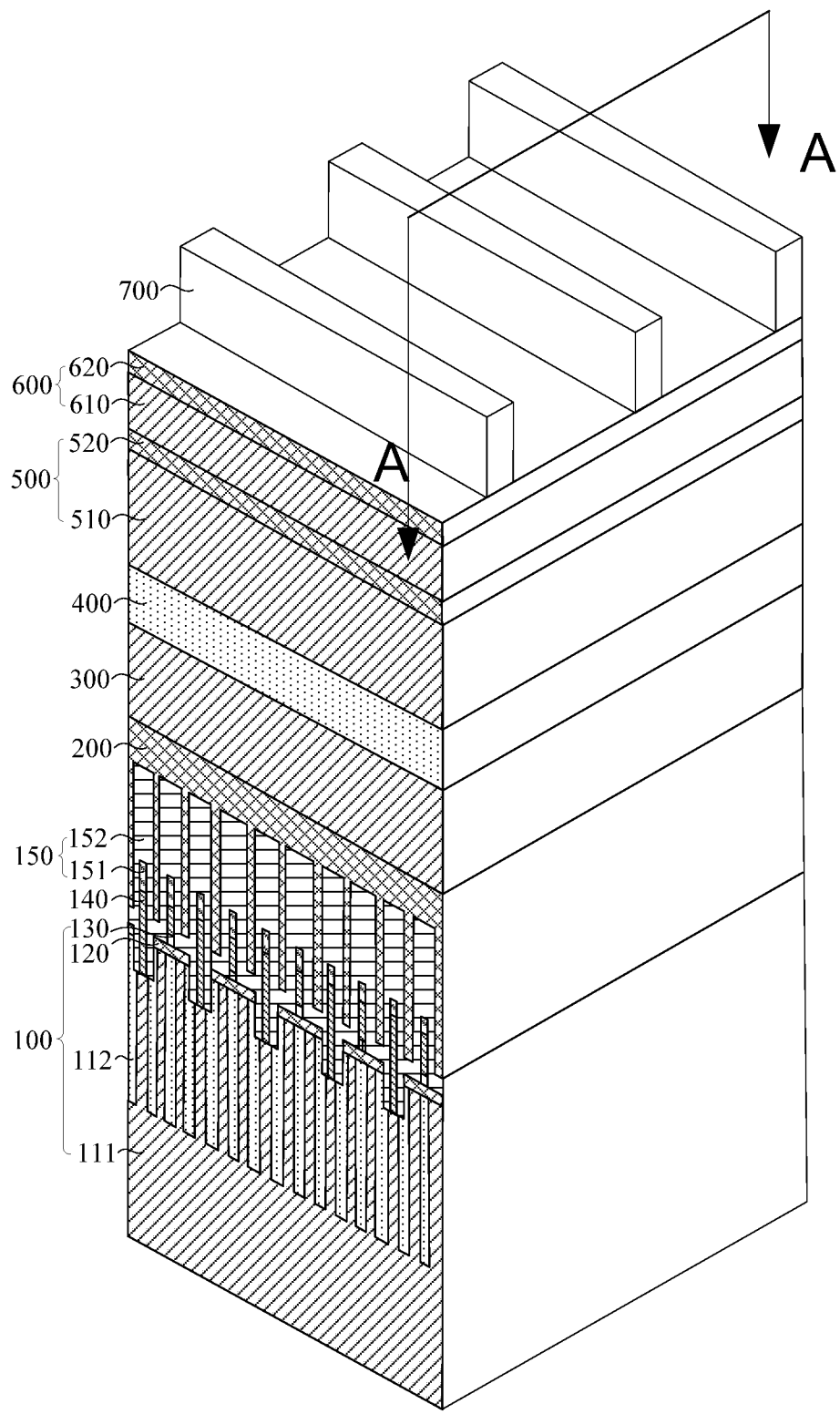
FIG. 3 is a three-dimensional diagram after a photoresist layer is formed in an embodiment of the disclosure.
Figure 4:
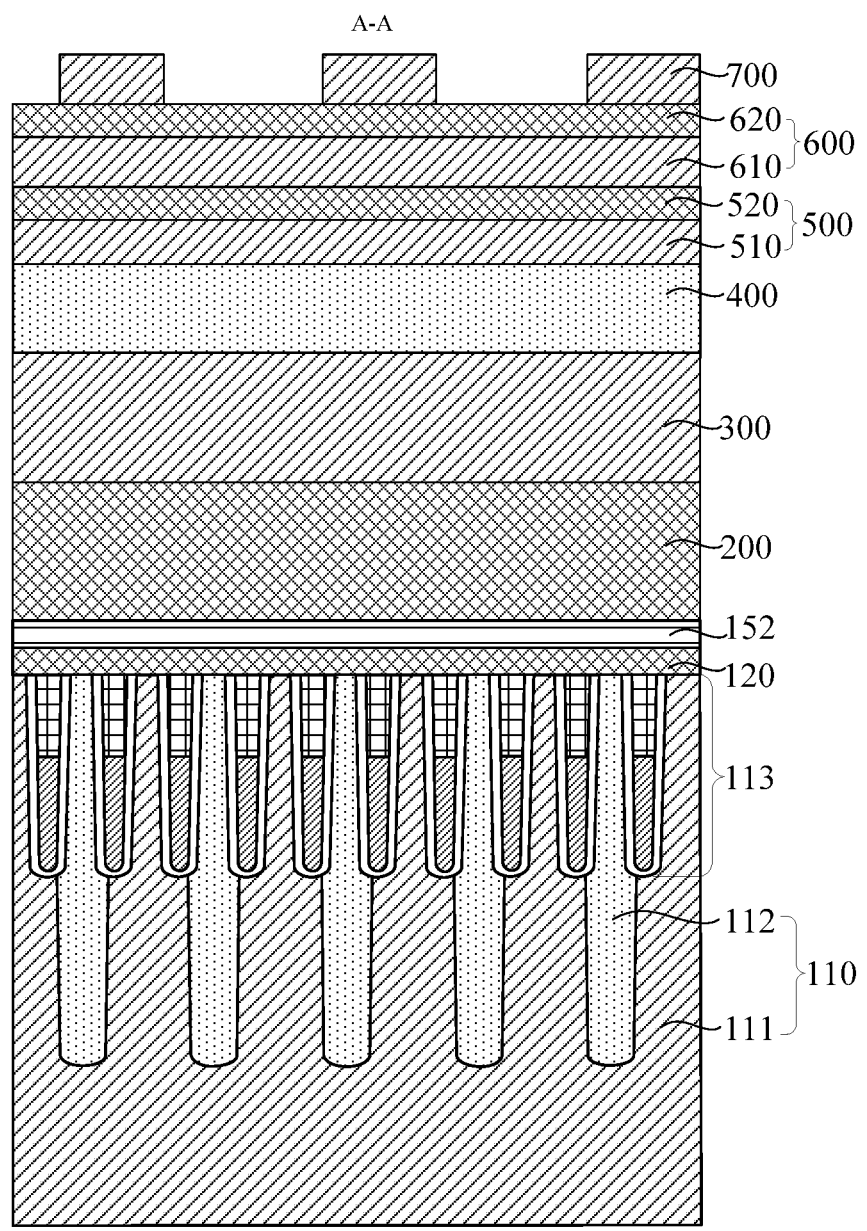
FIG. 4 is a cross-sectional schematic diagram at A-A of FIG. 3.

Referring to FIG. 2 to FIG. 4, the filling patterns shown in the drawings of the embodiments of the disclosure are only used to distinguish different structures in the drawings, and not used to indicate materials of the structures in the drawings. As shown in FIG. 2 to FIG. 4, a base 100 is used for supporting layers formed on the base 100, for example, a bit line 150 and a spin on hard mask layer 200.

As shown in FIG. 2 to FIG. 4, a plurality of active areas 111 arranged at intervals are provided in the base 100. The active areas 111 can be defined by shallow trench isolations (STIs) 112. Specifically, part of the base 100 is removed to a preset depth by an etching process to form grooves surrounding a plurality of active areas 111, and then an insulating material is deposited in the grooves to isolate the active areas 111 from each other. The insulating material may be silicon oxide, silicon nitride or the like.

Exemplarily, the base 100 may include a substrate 110, an insulating layer 120 and a barrier layer 130 stacked in sequence. Herein, the substrate 110 may be a semiconductor substrate 110, for example, a silicon substrate, a germanium substrate, a silicon-germanium substrate, a germanium-arsenic substrate, a silicon-on-insulator (SOI) substrate or a germanium-on-insulator (GOI) substrate, etc. The substrate 110 may be doped or undoped, and exemplarily, the substrate 110 may be an N-type substrate or a P-type substrate.

The above said active areas 111 are formed in the substrate 110 and exposed at the top surface of the substrate 110. A plurality of word lines 113 arranged at intervals are also formed in the substrate 110. As shown in FIG. 4, a plurality of word lines 113 extend in a second direction and the word lines 113 are respectively insulated from the active areas 111. Herein, the word lines 113 may be buried word lines (BWLs), and the active areas 111 are arranged obliquely to the extending direction of the word lines 113 so as to increase the arrangement density of the active area 111.

Still referring to FIG. 2 and FIG. 3, the insulating layer 120 is formed on the substrate 110 and covers the active areas 111 to isolate and protect the active areas 111. The material of the insulating layer 120 may be the same as the insulating material in the shallow trench isolations 112. After the shallow trench isolations 112 are formed by depositing the insulating material, the insulating material is continuously deposited to form the insulating layer 120, so as to simplify the manufacturing operations of the semiconductor structure.

A barrier layer 130 is formed on the insulating layer 120, and the barrier layer 130 corresponds to bit lines 150. The material of the barrier layer 130 may be silicon nitride or silicon oxynitride, and the barrier layer 130 can be used as an etching stop layer in a subsequent process to reduce the etching of the insulating layer 120. A plurality of contact holes are formed in the barrier layer 130 and the insulating layer 120, and the contact holes respectively expose the active areas 111. Exemplarily, two contact holes correspond to one active area 111, and each of the two contact holes exposes one end of the active area 111.

Still referring to FIG. 2 and FIG. 3, a plurality of bit lines 150 arranged at intervals are provided on the base 100. Each bit line 150 extends in a first direction, and is electrically connected to at least one active area 111. Exemplarily, a bit line plug (also known as bit line contact) 140 is provided in each of the contact holes, and the bit line plug 140 is in contact with one of the active areas 111. The bit line plugs 140 may be a plurality of columnar structures filled in the contact holes. Alternatively, as shown in FIG. 2, the bit line plugs 140 may have a comb-teeth structure, in which each tooth of the comb is filled in each contact hole. When forming the bit line plugs 140 and the bit lines 150 by etching, the barrier layer 130 is also etched, such that the retained barrier layer 130 corresponds to each bit line plug 140, i.e. the bit line plugs 140 located outside the contact holes are respectively deposited on the barrier layer 130. It can be understood that, the cross-section at A-A shown in FIG. 4 is the plane located between two adjacent bit lines, and there is no barrier layer 130 in this plane.

Still referring to FIG. 2 and FIG. 3, in some possible examples, a bit line 150 includes a second conductive layer 151 and a second supporting layer 152 covering the second conductive layer 151. The second conductive layer 151 extends in the first direction and is in contact with a bit line plug 140, and the bit line 150 is electrically connected to an active area 111 via the bit line plug 140. As shown in FIG. 2 and FIG. 3, the second supporting layer 152 also covers the base 100 between two adjacent ones of the second conductive layers 151.

As shown in FIG. 2, in the second supporting layer 152, an oxide layer 153 is provided at either side of the second conductive layer 151. For example, two oxide layers 153 are provided at two sides of the second conductive layer 151, respectively. The oxide layers 153 are not in contact with the second conductive layer 151. No oxide Layer 153 is shown in FIG. 3.

Herein, as shown in FIG. 2, the material of the bit line plug 140 may be polysilicon. The second conductive layer 151 may be a metal layer or a metal stack. For example, the second conductive layer 151 includes a titanium nitride layer in contact with the bit line plug 140 and a tungsten layer located on the titanium nitride layer. The second supporting layer 152 may be a nitride layer, such as a silicon nitride layer. In the direction away from a sidewall of the second conductive layer 151, there are a nitride, an oxide and another nitride (NON) in sequence.

Referring to FIG. 3 and FIG. 4, a spin on hard mask (SOH) layer 200 is filled between the bit lines 150 and covers the bit lines 150. The selectivity ratio between the spin on hard mask layer 200 and the second supporting layer 152 of the bit line 150 is large, so that the etching loss of the second supporting layer 152 is less in the subsequent process for etching the spin on hard mask layer 200, thus reducing the loss of the bit line 150 and ensuring the performance of the bit line 150. Exemplarily, the selection ratio between the spin on hard mask layer 200 and the second supporting layer 152 is greater than or equal to 5.

At S102, part of the spin on hard mask layer is removed to form a plurality of first trenches arranged at intervals and extending in a second direction.

Referring to FIG. 4, part of a spin on hard mask layer 200 is removed by a process of dry etching or wet etching to form a plurality of first trenches arranged at intervals and extending in a second direction. There is an angle between the second direction and the first direction, for example, the second direction is perpendicular to the first direction. After the first trenches are formed, the spin on hard mask layer 200 is divided into a plurality of pieces by the first trenches.

It can be understood that, each of the first trenches includes a second groove located on each bit line and extending in the second direction, and filling holes located between two adjacent ones of the bit lines and in communication with the second groove. That is, in the process of forming the first trenches, the second grooves are formed in the spin on hard mask layer 200 located on the bit lines, and the filling holes are formed in the spin on hard mask layer 200 between the bit lines. The second grooves are in communication with the filling holes located below the second grooves.

At S103, first sacrificial layers are formed in the first trenches, in which the first sacrificial layers are filled in the first trenches.

Figure 5:
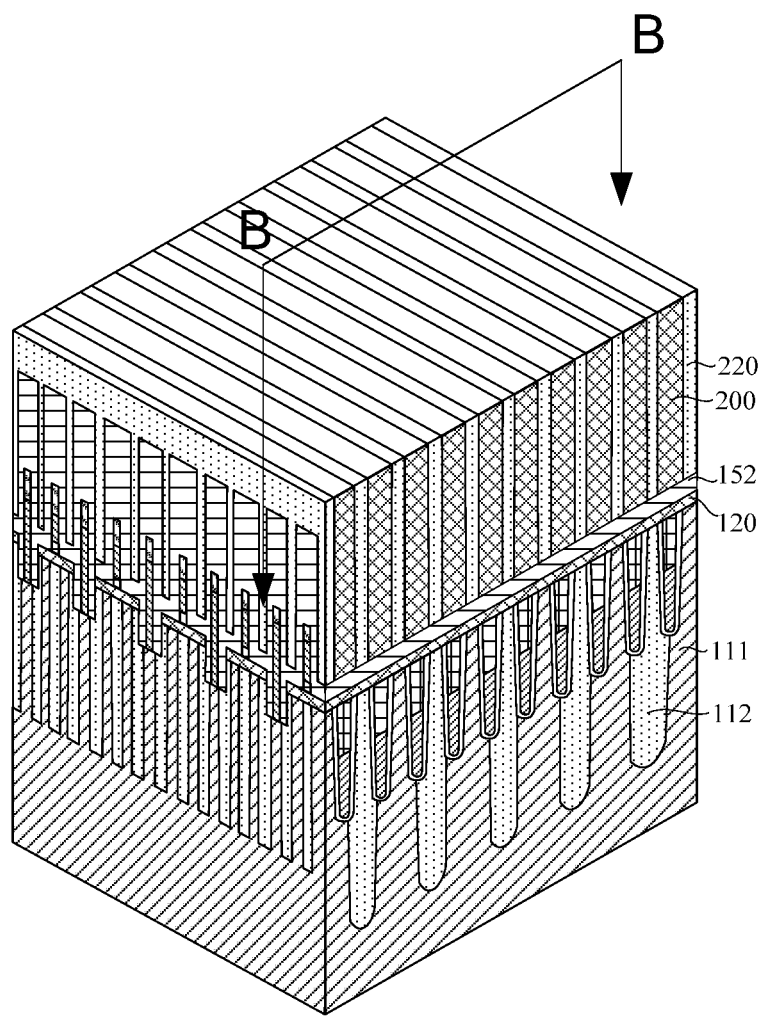
FIG. 5 is a three-dimensional diagram after first sacrificial layers are formed in an embodiment of the disclosure.
Figure 6:
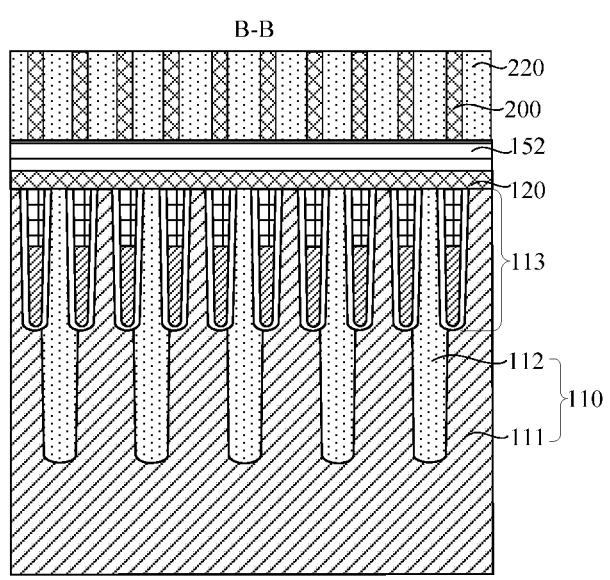
FIG. 6 is a cross-sectional schematic diagram at B-B of FIG. 5.

Referring to FIG. 5 and FIG. 6, first sacrificial layers 220 are deposited in the first trenches, in which the first sacrificial layers fill up the first trenches. Exemplarily, the first sacrificial layers may be formed by a process of chemical vapor deposition (CVD), physical vapor deposition (PVD), atomic layer deposition (ALD) or the like. The material of the first sacrificial layers 220 can be an oxide, such as silicon oxide, to facilitate subsequent removal.

At S104, the spin on hard mask layer between the first sacrificial layers is removed to form second trenches.

Figure 7:
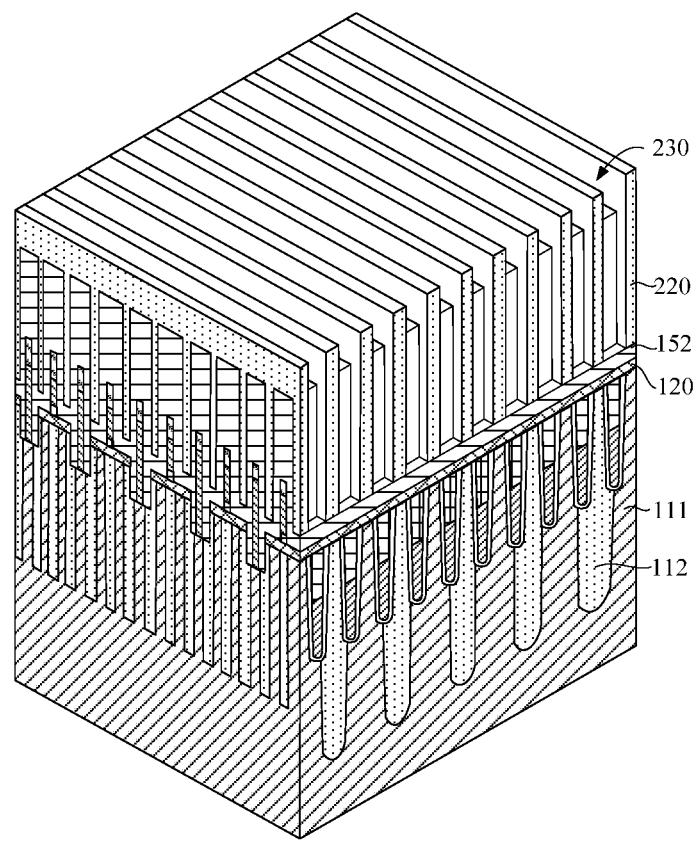
FIG. 7 is a three-dimensional diagram after second trenches are formed in an embodiment of the disclosure.

Referring to FIG. 7, the spin on hard mask layer 200 between the first sacrificial layers 220 is removed by etching after the first sacrificial layers 220 are formed. It can be understood that, the spin on hard mask layer 200 is removed in two operations, in which the first trenches are formed after removing part of the spin on hard mask layer 200 in the first operation, and second trenches 230 are formed after removing the retained spin on hard mask layer 200 in the second operation. The shape of each second trench 230 is roughly the same as the shape of each first trench.

At S105, first supporting layers are formed in the second trenches, in which each of the first supporting layers is filled in the second trenches.

Figure 8:
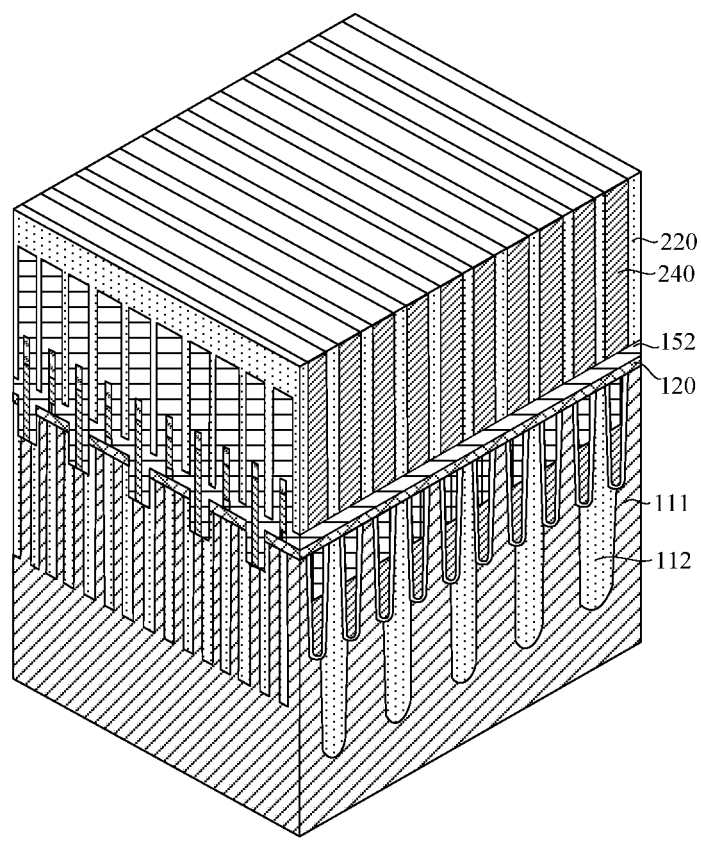
FIG. 8 is a three-dimensional diagram after first supporting layers are formed in an embodiment of the disclosure.

Referring to FIG. 7 and FIG. 8, first supporting layers 240 are deposited in the second trenches 230, in which the first supporting layers 240 respectively fill up the second trenches 230. The material of the first supporting layers 240 may be the same as the material of the second supporting layers 152 of the bit lines 150, both of which are insulating materials, for example, silicon nitride.

At S106, the first sacrificial layers are removed and the first trenches located between adjacent bit lines are elongated to the active areas.

Figure 9:
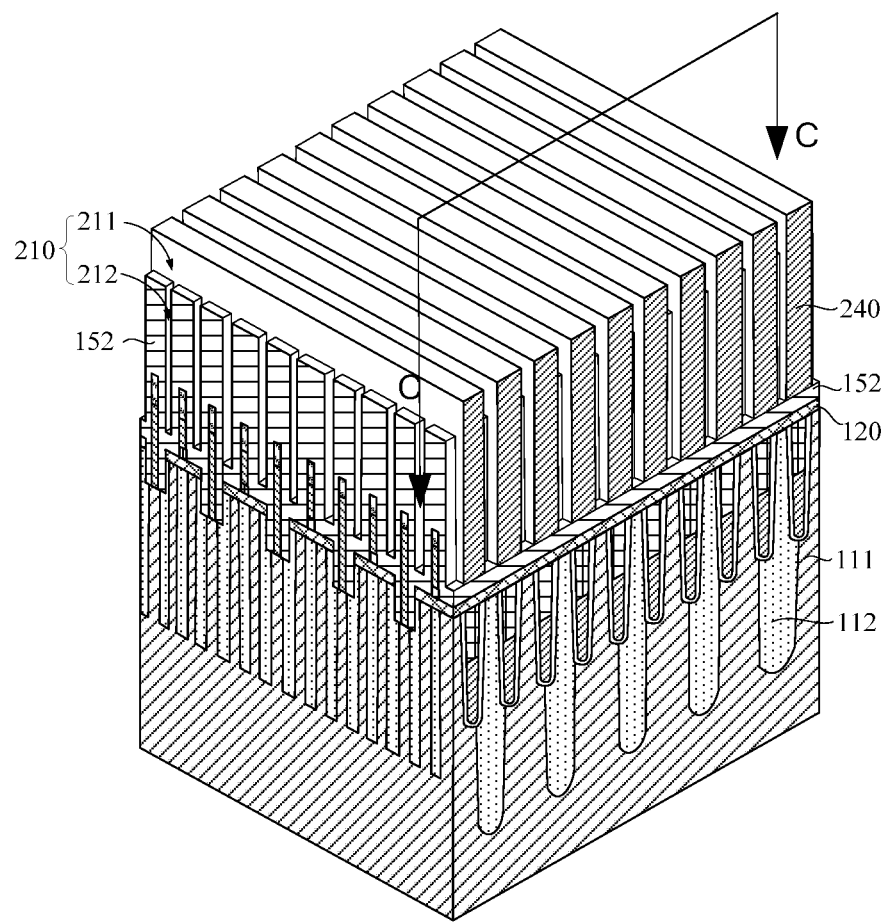
FIG. 9 is a three-dimensional diagram after retained spin on hard mask layer is removed in an embodiment of the disclosure.
Figure 10:
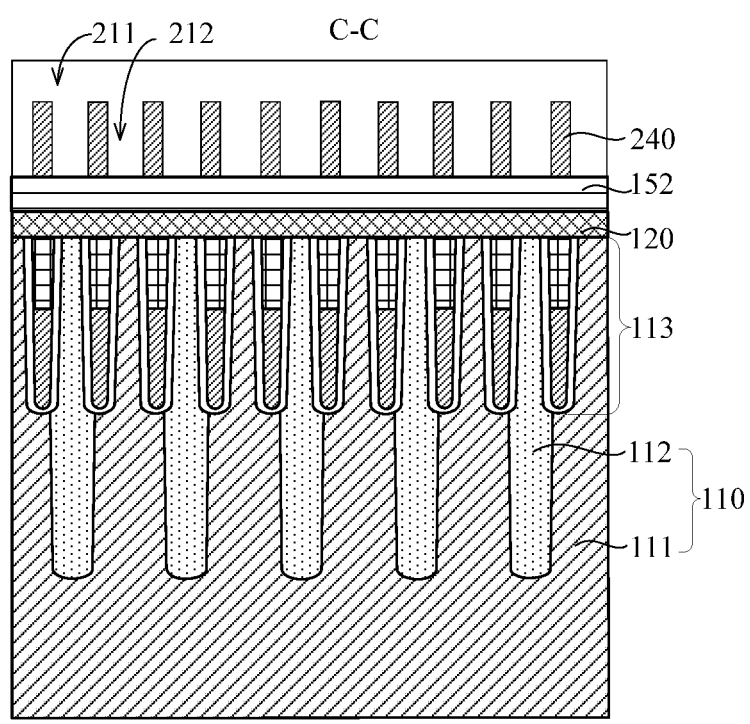
FIG. 10 is a cross-sectional schematic diagram at C-C of FIG. 9.
Figure 11:
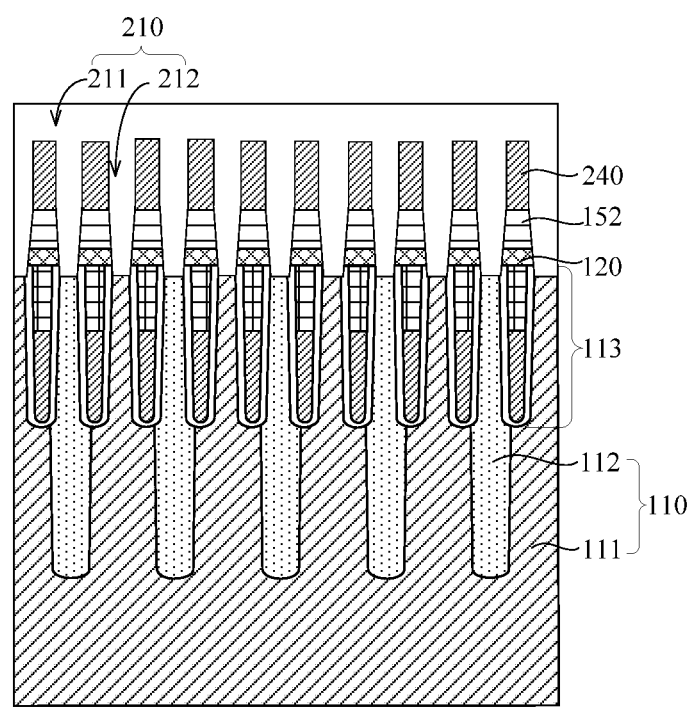
FIG. 11 is a schematic structural diagram after contact holes are elongated to active areas in an embodiment of the disclosure.

Referring to FIG. 8 to FIG. 11, the first sacrificial layers 220 are removed by etching. Exemplarily, the first sacrificial layers 220 are removed by a process of wet etching with an acidic etchant, and there is a large selectivity ratio between the first sacrificial layers 220 and the first supporting layers 240, so as to reduce damage of the first supporting layers 240. After the first sacrificial layers 220 are removed, the first trenches 210 are exposed. As shown in FIG. 11, the first trenches 210 located between adjacent bit lines 150 are also elongated to the active areas 111 to expose the active areas 11 in the first trenches 210.

In an possible embodiment, a base 100 includes a substrate 110, an insulating layer 120 provided on the substrate 110, a barrier layer 130 provided on the insulating layer 120 in sequence, in which a plurality of active areas 111 are provided in the substrate 110, and the insulating layer 120 covers the active areas 111. Accordingly, removing the first sacrificial layers 220 and elongating the first trenches 210 located between adjacent bit lines 150 to the active areas 111 includes the following operations.

Referring to FIG. 8 to FIG. 10, the first sacrificial layers 220 are etched to expose the first trenches 210. Each of the first trenches 210 includes a second groove 211 located on the bit lines 150 and extending in the second direction, and filling holes 212 located between adjacent bit lines 150 and in communication with the second groove 211. As shown in FIG. 9 and FIG. 10, the second supporting layers 152 extending in the second direction and the first supporting layers 240 extending in the first direction define the aforementioned filling holes 212.

Referring to FIG. 11, the insulating layer 120 is etched along the filling holes 212 of the first trenches 210, so as to expose the active areas 111 by the filling holes 212. As shown in FIG. 11, a filling hole 212 penetrates through the insulating layer 120 and extends to an active area 111, so that the active area 111 is exposed in the filling hole 212, which facilitates the electrical connection between the active area 111 and a conductive pillar 250 formed in the filling hole 212. It should be noted that, when a second supporting layer 152 also covers the base 100, the filling hole 212 also penetrates through the second supporting layer 152, that is, the filling hole 212 penetrates through the second supporting layer 152 and the insulating layer 120, and extends to the active area 111.

To sum up, according to the method for manufacturing a semiconductor structure in the embodiments of the disclosure, the spin on hard mask layer 200 filled between the bit lines 150 and covering the bit lines 150 is formed, and the high selectivity ratio between the spin on hard mask layer 200 and the bit lines 150 is utilized, thus the loss of portion of each bit line 150 far away from the base 100 during subsequent etching is reduced, thereby ensuring the performance of the bit line 150.

In some possible examples, referring to FIG. 12 to FIG. 17, removing part of the spin on hard mask layer to form a plurality of first trenches arranged at intervals and extending in a second direction (S102) may include the following operations.

At S1021, an intermediate layer and a silicon-containing anti-reflection layer stacked in sequence are formed on the spin on hard mask layer, in which the silicon-containing anti-reflection layer has a plurality of first grooves arranged at intervals and extending in the second direction.

Figure 12:
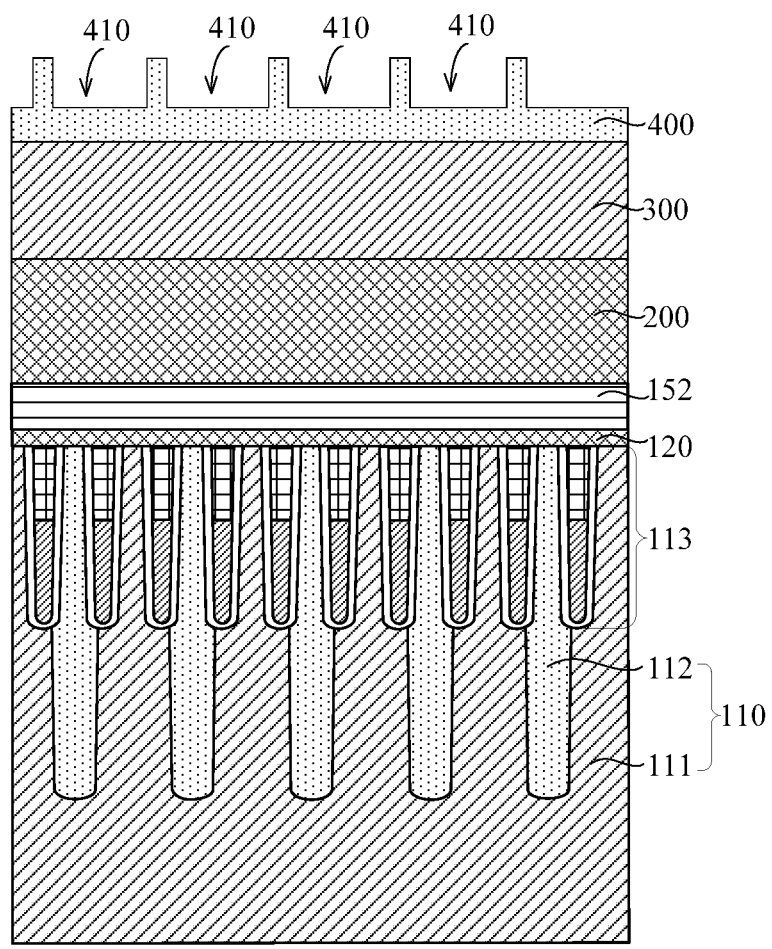
FIG. 12 is a schematic structural diagram after first grooves are formed in an embodiment of the disclosure.

Referring to FIG. 12, an intermediate layer 300 is formed on the spin on hard mask layer 200 by a process of deposition and covers the spin on hard mask layer 200. A silicon-containing anti-reflection (SiARC) layer 400 is formed on the intermediate layer 300 by a process of deposition and covers the intermediate layer 300. Of course, the silicon-containing anti-reflection layer 400 may also be formed on the intermediate layer 300 by a spin on coating process. Herein, the intermediate layer 300 may be an amorphous carbon layer (ACL). The hardness of the silicon-containing anti-reflection layer 400 is relatively high, and it is not easy to collapse and deform when etching first grooves 410 of the silicon-containing anti-reflection layer 400 or other structures, and the precision of the pattern formed after the etching is good.

As shown in FIG. 12, a plurality of first grooves 410 are formed in the silicon-containing anti-reflection layer 400, and the plurality of first grooves 410 are arranged at intervals and extend in the second direction. The first grooves 410 may penetrate through the silicon-containing anti-reflection layer 400 or may not. As shown in FIG. 12, bottoms of the first grooves 410 are located in the silicon-containing anti-reflection layer 400, that is, the first grooves 410 are formed in the upper part of the silicon-containing anti-reflection layer 400 far away from the base 100, and first etching grooves are formed subsequently in the lower part of the silicon-containing anti-reflection layer 400 by utilizing the first grooves 410. The width of the first etching grooves is less than the width of the first grooves 410, and the density of the first etching grooves is greater than the density of the first grooves 410, so as to further reduce the feature size of the semiconductor structure and improve the integration level of the semiconductor structure.

At S1022, a second sacrificial layer is formed on sidewalls of the first grooves, in which the second sacrificial layer located in the first grooves defines third grooves.

Figure 13:
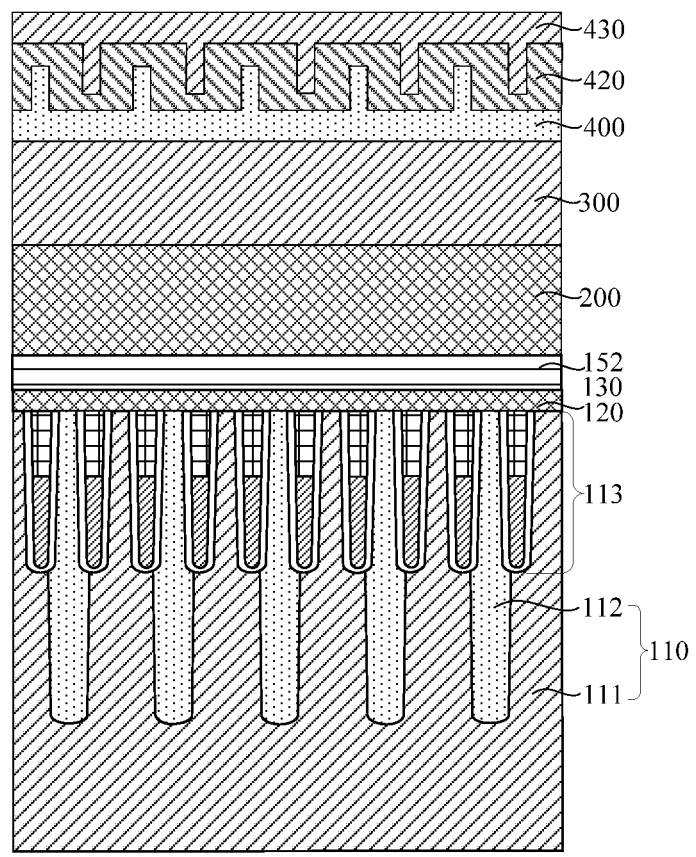
FIG. 13 is a schematic structural diagram after a first filling layer is formed in an embodiment of the disclosure.

Specifically, referring to FIG. 12 and FIG. 13, a second sacrificial layer 420 is deposited on sidewalls and bottoms of the first grooves 410, and on the silicon-containing anti-reflection layer 400. The second sacrificial layer 420 covers the surface of the side of the silicon-containing anti-reflection layer 400 facing away from the base 100. That is, the second sacrificial layer 420 is a whole layer, which is conductive to the formation of the second sacrificial layer 420. The material of the second sacrificial layer 420 may be silicon oxide.

At S1023, a first filling layer is formed in the third grooves.

Still referring to FIG. 12 and FIG. 13, a first filling layer 430 is deposited in the third grooves. The material of the first filling layer 430 may be a spin on hard mask material. In some possible examples, as shown in FIG. 13, a filling layer 430 is deposited in the third grooves and on the second sacrificial layer 420. The first filling layer 430 is filled up the third grooves and covers the second sacrificial layer 420.

Figure 14:
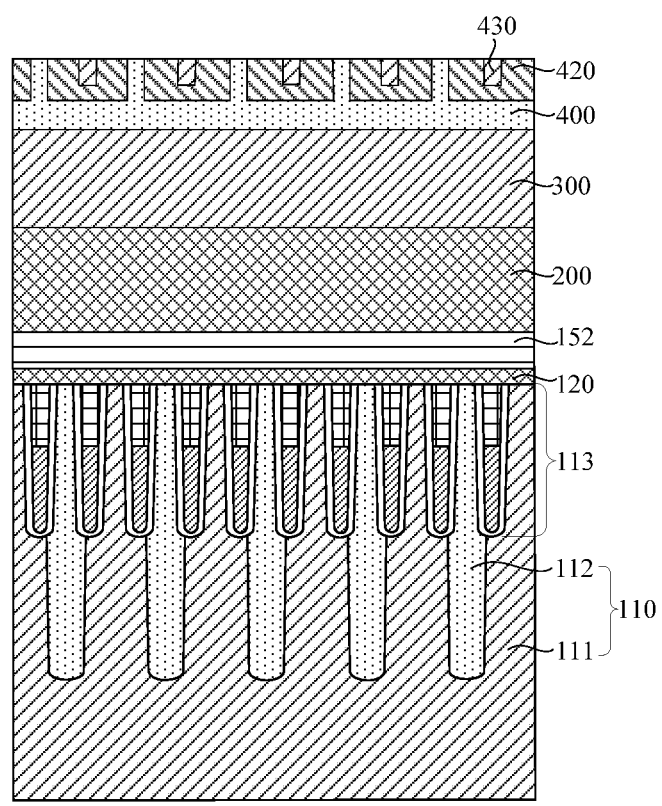
FIG. 14 is a schematic structural diagram after a second sacrificial layer is exposed in an embodiment of the disclosure.

Referring to FIG. 14, part of the first filling layer 430 and part of the second sacrificial layer 420 are removed to expose the second sacrificial layer 420 located on the sidewalls of the first grooves 410. Specifically, the second sacrificial layer 420 located on the surface of the silicon-containing anti-reflection layer 400 away from the base 100 and the first filling layer 430 are removed to expose the surface of the silicon-containing anti-reflection layer 400 and the second sacrificial layer 420 located on the sidewalls of the first grooves 410. For example, a part of the first filling layer 430 and a part of the second sacrificial layer 420 are removed by a process of etching or planarization.

At S1024, the second sacrificial layer located on the sidewalls of the first grooves is removed to form the first etching grooves.

Figure 15:
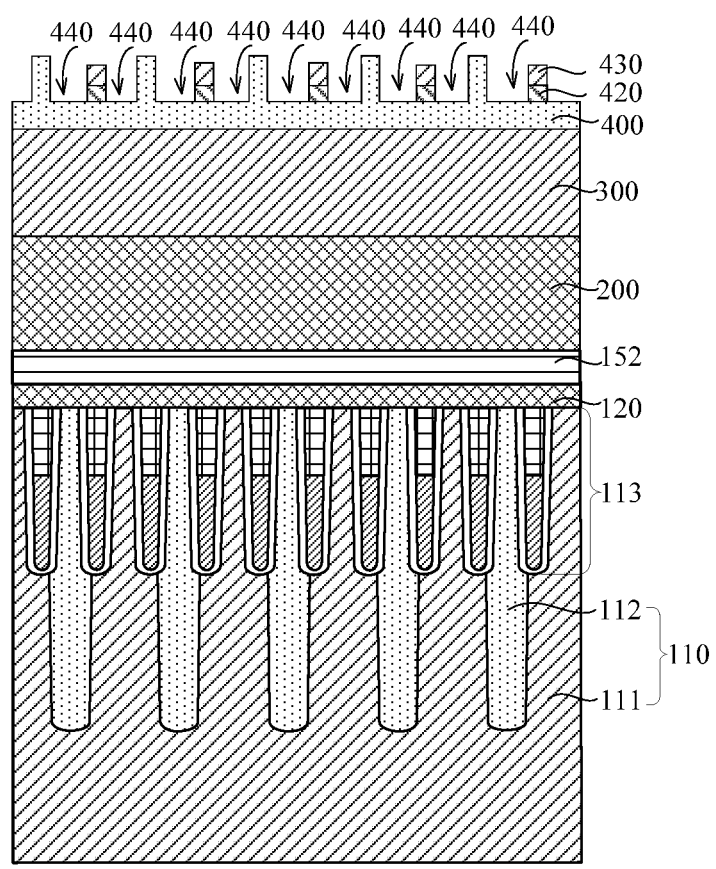
FIG. 15 is a schematic structural diagram after first etching grooves are formed in an embodiment of the disclosure.

Referring to FIG. 15, the second sacrificial layer 420 is etched to form the first etching grooves 440. It can be understood that, in the process of etching the second sacrificial layer 420, part of the silicon-containing anti-reflection layer 400 and part of the first filling layer 430 may be removed by the etching. The bottoms of first etching grooves 440 expose the silicon-containing anti-reflection layer 400.

It should be noted that, still referring to FIG. 15, the selection ratio of the silicon-containing anti-reflection layer 400 and the selection ratio of the first filling layer 430 are different. After the etching is finished, there is a height difference between the silicon-containing anti-reflection layer 400 and the first filling layer 430. Exemplarily, the etching rate of the silicon-containing anti-reflection layer 400 is slower than the etching rate of the first filling layer 430. After the second sacrificial layer 420 is removed by etching, less height of the silicon-containing anti-reflection layer 400 is etched away during the etching, while more height of the first filling layer 430 is etched away during the etching, in the height direction, that is, in the direction perpendicular to the substrate 110. As shown in FIG. 15, the surface of the retained silicon-containing anti-reflection layer 400 away from the substrate 110 is higher than the surface of the retained first filling layer 430 away from the substrate 110.

At S1025, etching is performed along the first etching grooves to the spin on hard mask layer to form the first trenches.

Figure 16:
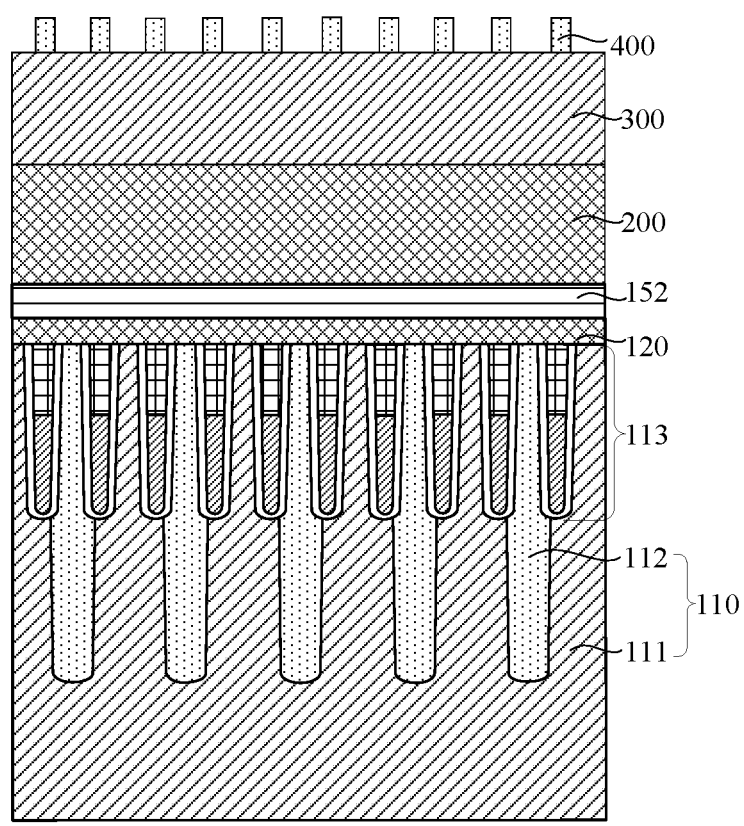
FIG. 16 is a schematic structural diagram after a silicon-containing anti-reflection layer is penetrated with first etching grooves in an embodiment of the disclosure.
Figure 17:
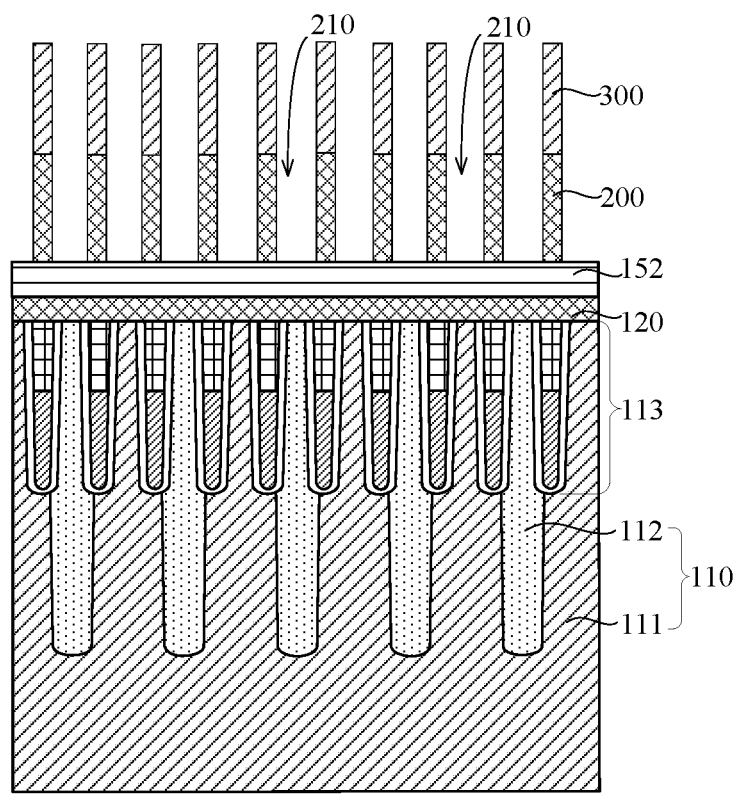
FIG. 17 is a schematic structural diagram after first trenches are formed in an embodiment of the disclosure.

Referring to FIG. 16 and FIG. 17, the silicon-containing anti-reflection layer 400, the intermediate layer 300 and the spin on hard mask layer 200 are etched along the first etching grooves 440 to form the first trenches 210 in the spin on hard mask layer 200. In the embodiments of the disclosure, the silicon-containing anti-reflection layer 400 is used as a transfer layer of the etching pattern to reduce the sizes of the first etching grooves 440. In addition, no extreme ultraviolet (EUV) lithography process is used in this process, thus reducing the production cost.

In some possible embodiments, referring to FIG. 3, FIG. 4, FIG. 18 to FIG. 20, forming the intermediate layer and the silicon-containing anti-reflection layer stacked in sequence on the spin on hard mask layer, in which the silicon-containing anti-reflection layer has the plurality of first grooves arranged at intervals and extending in the second direction, included the following operations.

(a) A first mask layer, a second mask layer and a photoresist layer stacked in sequence are formed on the silicon-containing anti-reflection layer.

Referring to FIG. 3 and FIG. 4, a first mask layer 500 is deposited on the silicon-containing anti-reflection layer 400, in which the first mask layer 500 covers the silicon-containing anti-reflection layer 400; a second mask layer 600 is deposited on the first mask layer 500, in which the second mask layer 600 covers the first mask layer 500; and a photoresist layer 700 is formed on the first mask layer 500 by a process of spin on coating, spray coating or brush coating.

Exemplarily, as shown in FIG. 3 and FIG. 4, the first mask layer 500 includes a first foundation layer 510 provided on the silicon-containing anti-reflection layer 400, and a first anti-reflection layer 520 provided on the first foundation layer 510; and the second mask layer 600 includes a second foundation layer 610 provided on the first anti-reflection layer 520 and a second anti-reflection layer 620 provided on the second foundation layer 610. That is, the silicon-containing anti-reflection layer 400, the first foundation layer 510, the first anti-reflection layer 520, the second foundation layer 610, the second anti-reflection layer 620 and the photoresist layer 700 are stacked in sequence in a direction away from the base 100.

Still referring to FIG. 3 and FIG. 4, the photoresist layer 700 is a patterned photoresist (PR) layer, that is, the photoresist layer 700 with a preset pattern is formed by a process of exposure, development and the like. The photoresist layer 700 exposes part of the second anti-reflection layer 620. The second anti-reflection layer 620 may absorb the light used for exposuring the photoresist layer 700, thereby reducing or preventing the reflection of the light at the second anti-reflection layer 620 to improve the accuracy of the preset pattern of the photoresist layer 700. The material of the first foundation layer 510 is the same as the material of the second foundation layer 610, and the material of the first anti-reflection layer 520 is the same as the material of the second anti-reflection layer 620, so as to reduce the types of materials used during manufacturing the semiconductor structure. Exemplarily, the material of the first foundation layer 510 and the second foundation layer 610 may be a spin on hard mask composition, and the material of the first anti-reflection layer 520 and the second anti-reflection layer 620 may be silicon oxynitride.

(b) The second mask layer is etched by taking the photoresist layer as a mask to form a plurality of first intermediate grooves arranged at intervals and extending in the second direction in the second mask layer.

Figure 18:
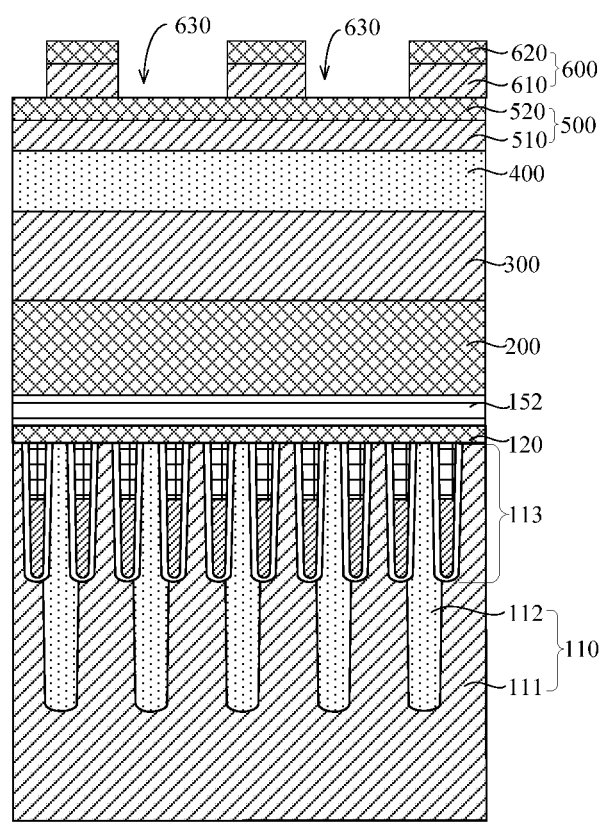
FIG. 18 is a schematic structural diagram after first intermediate grooves are formed in an embodiment of the disclosure.

Referring to FIG. 4 and FIG. 18, the second mask layer 600 is etched by taking the photoresist layer 700 as a mask. The second mask layer 600 not covered by the photoresist layer 700 is removed, meanwhile the second mask layer 600 covered by the photoresist layer 700 is retained. A plurality of first intermediate grooves 630 arranged at intervals and extending in the second direction are formed in the second mask layer 600. The first intermediate grooves 630 penetrate through the second mask layer 600 to expose the first mask layer 500. In this way, the preset pattern of the photoresist layer 700 is transferred to the second mask layer 600, and the first intermediate grooves 630 are formed in the second mask layer 600.

(c) A third sacrificial layer is deposited on sidewalls and bottoms of the first intermediate grooves, and on the second mask layer. The third sacrificial layer located in the first intermediate grooves defines second intermediate grooves.

Figure 19:
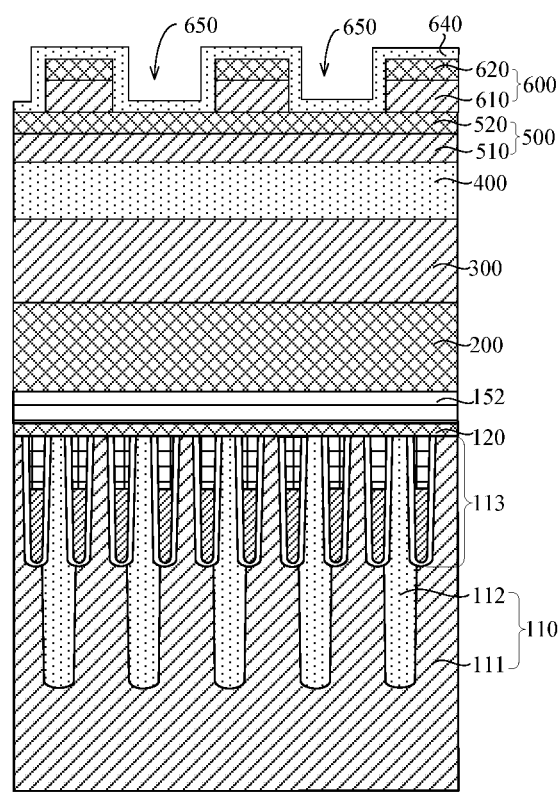
FIG. 19 is a schematic structural diagram after a third sacrificial layer is formed in an embodiment of the disclosure.

Referring to FIG. 18 and FIG. 19, a third sacrificial layer 640 is deposited on sidewalls and bottoms of the first intermediate grooves 630, and on the second mask layer 600. For example, the third sacrificial layer 640 is formed by a process of atomic layer deposition process, so as to form the third sacrificial layer 640 with a better quality. The material of the third sacrificial layer 640 may be silicon oxide.

(d) The third sacrificial layer located on a top of the second mask layer and bottoms of the second intermediate grooves is removed to retain the third sacrificial layer located on the sidewalls of the first intermediate grooves.

Figure 20:
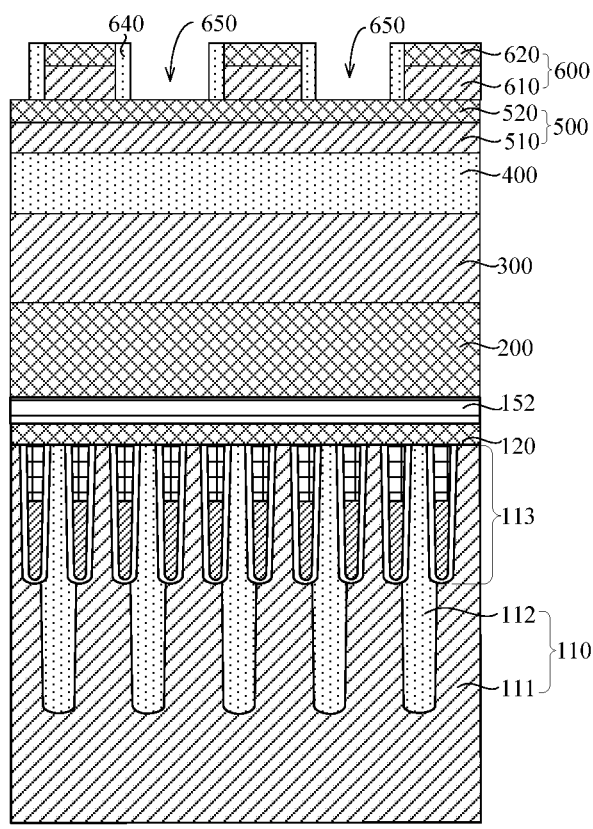
FIG. 20 is a schematic structural diagram after part of a third sacrificial layer is removed in an embodiment of the disclosure.

Referring to FIG. 20, the third sacrificial layer 640 located on a top of the second mask layer 600 and bottoms of the second intermediate grooves 650 is removed by a process of etching to retain the third sacrificial layer 640 located on the sidewalls of the first intermediate grooves 630. After the etching, the second mask layer 600 and the first mask layer 500 are exposed. That is, the third sacrificial layer 640 located on the sidewalls of the first intermediate grooves 630 is formed by depositing and then back etching.

(e) The second mask layer, the first mask layer and the silicon-containing anti-reflection layer are etched by taking the retained third sacrificial layer as a mask to form the first grooves.

Referring to FIG. 20 and FIG. 12, the second mask layer 600 sandwiched by the third sacrificial layer 640, the first mask layer 500 and the silicon-containing anti-reflection layer 400 are removed by etching to form the first grooves 410 in the silicon-containing anti-reflection layer 400. After the first grooves 410 are formed, other layers on the silicon-containing anti-reflection layer 400 are removed to expose the silicon-containing anti-reflection layer 400.

It should be noted that, the operations of forming the intermediate layers and the silicon-containing anti-reflection layer stacked in sequence on the spin on hard mask layer, in which the silicon-containing anti-reflection layer has a plurality of first grooves arranged at intervals and extending in the second direction, can also be performed in other ways. In other possible examples, it includes the following operations.

(a') A first mask layer, a second mask layer and a photoresist layer stacked in sequence are formed on the silicon-containing anti-reflection layer.

(b') The second mask layer is etched by taking the photoresist layer as a mask to form a plurality of first intermediate grooves arranged at intervals and extending in the second direction in the second mask layer.

(c') A third sacrificial layer is deposited on sidewalls and bottoms of the first intermediate grooves, and on the second mask layer. The third sacrificial layer located in the first intermediate grooves defines second intermediate grooves.

The operations of (a'), (b') and (c') in the example can refer to the operations of (a), (b) and (c) in the above example, and will not be repeated here.

(d') A second filling layer is formed in the second intermediate grooves and on the third sacrificial layer.

The second filling layer is formed by a process of deposition. The second filling layer fills up the second intermediate grooves and covers the third sacrificial layer. The material of the second filling layer may be a spin on hard mask composition.

(e') Part of the second filling layer and part of the third sacrificial layer are removed to expose the third sacrificial layer located on the sidewalls of the first intermediate grooves.

Exemplarily, part of the second filling layer located on the surface of the second mask layer away from the base and part of the third sacrificial layer are removed by a process of planarization to expose the surface as well as the third sacrificial layer located on the sidewalls of the first intermediate grooves.

(f) The third sacrificial layer, the first mask layer and the silicon-containing anti-reflection layer are etched to form the first grooves.

The third sacrificial layer, the first mask layer and the silicon-containing anti-reflection layer below the third sacrificial layer are etched to form the first grooves in the silicon-containing anti-reflection layer. During the etching, layers above the silicon-containing anti-reflection layer are also at least partially removed. The retained layer can be removed alone by a process of etching, and after the retained layer is removed, the silicon-containing anti-reflection layer is exposed.

It should be noted that, in the different examples of forming the intermediate layer and the silicon-containing anti-reflection layer arranged in sequence on the spin on hard mask layer and the silicon-containing anti-reflection layer having the plurality of first grooves arranged at intervals and extending in the second direction, the patterns of the photoresist layers are different to ensure that the positions of the first grooves finally formed are the same.

In the embodiments of the disclosure, the first grooves 410 are formed in the silicon-containing anti-reflection layer 400 by a process of self-aligned double patterning (SADP), and the feature size of the formed first grooves 410 is reduced, while the density of them is increased. In addition, in the subsequent process of forming the first etching grooves 440 in the silicon-containing anti-reflection layer 400, a process of self-aligned double patterning is also performed, so that the feature size of the first etching grooves 440 is reduced and the density of them is increased, thereby further improving the integration level of the semiconductor structure formed subsequently.

In a possible example of the disclosure, referring to FIG. 12 to FIG. 14, a second sacrificial layer is deposited on sidewalls and bottoms of the first grooves, and on the silicon-containing anti-reflection layer. Accordingly, forming a first filling layer in the third grooves includes the following operations.

Referring to FIG. 13, a filling layer 430 is deposited in the third grooves and on the second sacrificial layer 420. As shown in FIG. 13, the first filling layer 430 is filled up the third grooves and covers the second sacrificial layer 420, that is, the surface of the first filling layer 430 away from the base 100 is higher than the surface of the second sacrificial layer 420 away from the base 100.

Referring to FIG. 14, part of the first filling layer 430 and part of the second sacrificial layer 420 are removed to expose the second sacrificial layer 420 located on the sidewalls of the first grooves 410. As shown in FIG. 14, the part of the first filling layer 430 and the part of the second sacrificial layer 420 are removed by a process of planarization to expose the silicon-containing anti-reflection layer 400 and the second sacrificial layer 420.

Figure 21:
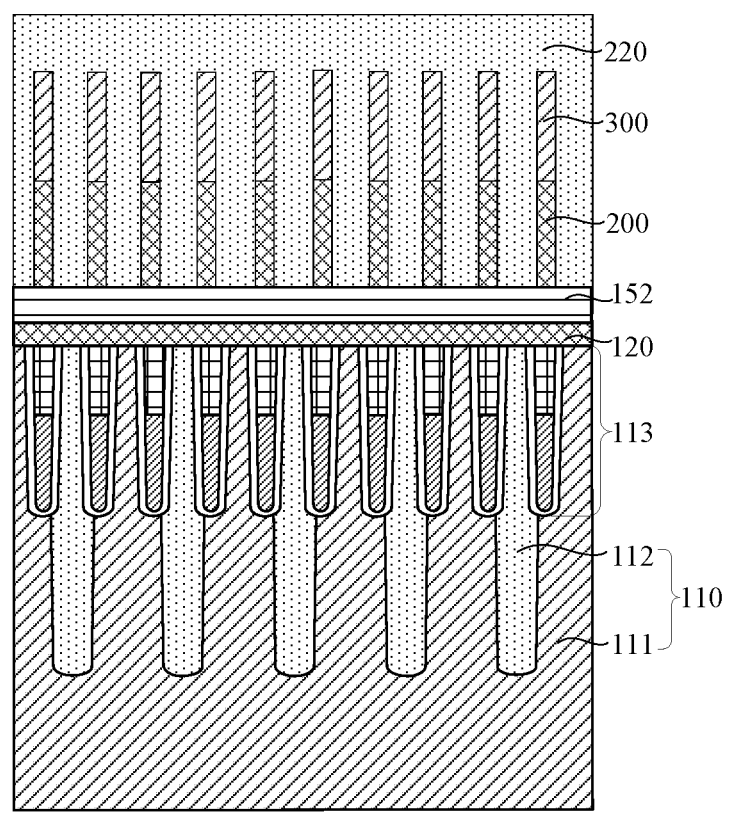
FIG. 21 is a schematic structural diagram after first sacrificial layers are formed in an embodiment of the disclosure.

In the embodiments of the disclosure, after the first trenches are formed, forming first sacrificial layers in the first trenches includes the following operation. The first sacrificial layers 220 are deposited in the first etching grooves and the first trenches 210. Referring to FIG. 21, the first sacrificial layers 220 are filled in the first trenches 210 and the first etching grooves, and may cover the intermediate layer 300 or the silicon-containing anti-reflection layer 400. It can be understood that during the etching of the spin on hard mask layer 200 to form the first trenches 210, part of the silicon-containing anti-reflection layer 400 is also etched away. The first sacrificial layers 220 cover the silicon-containing anti-reflection layer 400 when the silicon-containing anti-reflection layer 400 is not completely removed. The first sacrificial layers 220 cover the intermediate layer 300, when the silicon-containing anti-reflection layer 400 is removed completely and the intermediate layer 300 is exposed.

Figure 22:
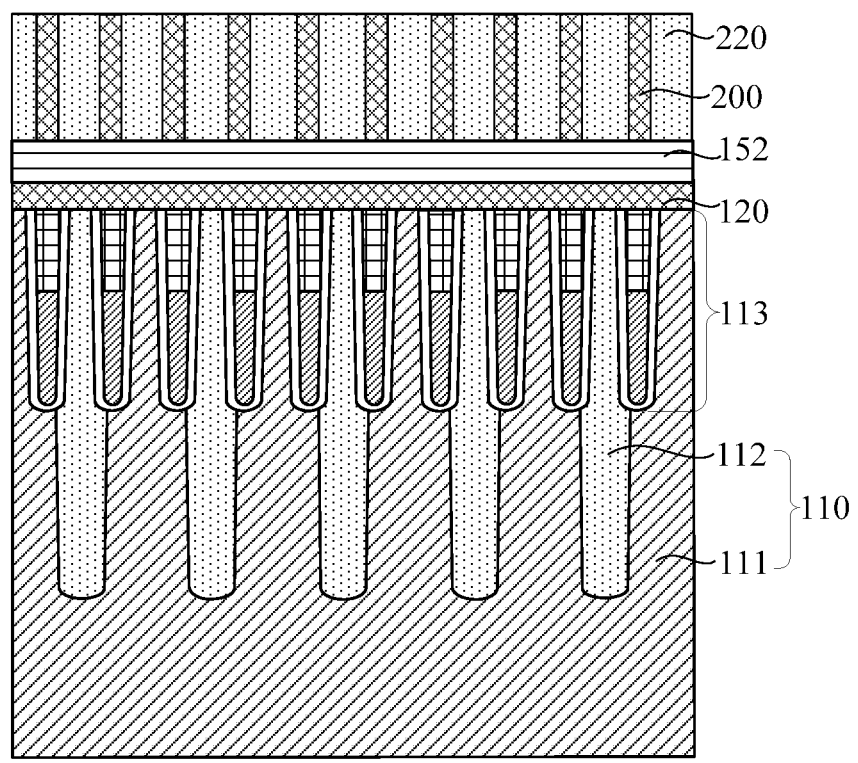
FIG. 22 is a schematic structural diagram after layers on a spin on hard mask layer are removed in an embodiment the disclosure.

It should be noted that, after the first sacrificial layers are formed in the first trenches, the method further includes the following operation. The intermediate layer, the first sacrificial layer, and the silicon-containing anti-reflection layer located on the spin on hard mask layer are removed to expose the spin on hard mask layer. Referring to FIG. 22, other layers located on the spin on hard mask layer 200 are removed by a process of planarization to expose the spin on hard mask layer 200, in order to conveniently remove the spin on hard mask layer 200 subsequently.

In some possible examples of the disclosure, after the first sacrificial layers are removed to expose the first trenches and elongate the filling holes of the first trenches to the active areas, the method further includes the following operation. Conductive pillars are formed in the filling holes, in which the conductive pillars are respectively electrically connected to the active areas.

Referring to FIG. 10, FIG. 23 to FIG. 25, each conductive pillar 250 is in contact with an active area 111 to achieve the electrical connection between the conductive pillar 250 and the active area 111. Each conductive pillar 250 is provided in each filling hole 212. The conductive pillars 250 are not connected with each other. Active areas 111 and word lines 113 are provided in the substrate 110, and the word lines 113 are insulated from the active areas 111 and staggered from the conductive pillars 250. Exemplarily, the word lines 113 pass through the middle areas of the active areas 111, and the conductive pillars 250 are electrically connected to the end areas of the active areas 111, respectively.

Figure 23:
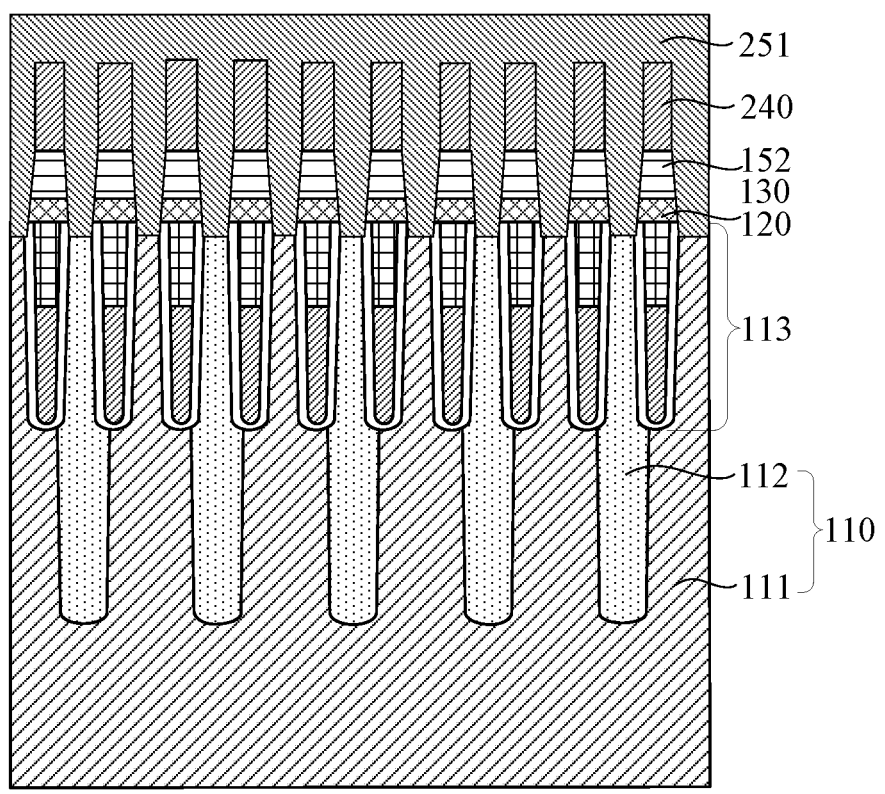
FIG. 23 is a schematic structural diagram after a first conductive layer is formed in an embodiment of the disclosure.
Figure 24:
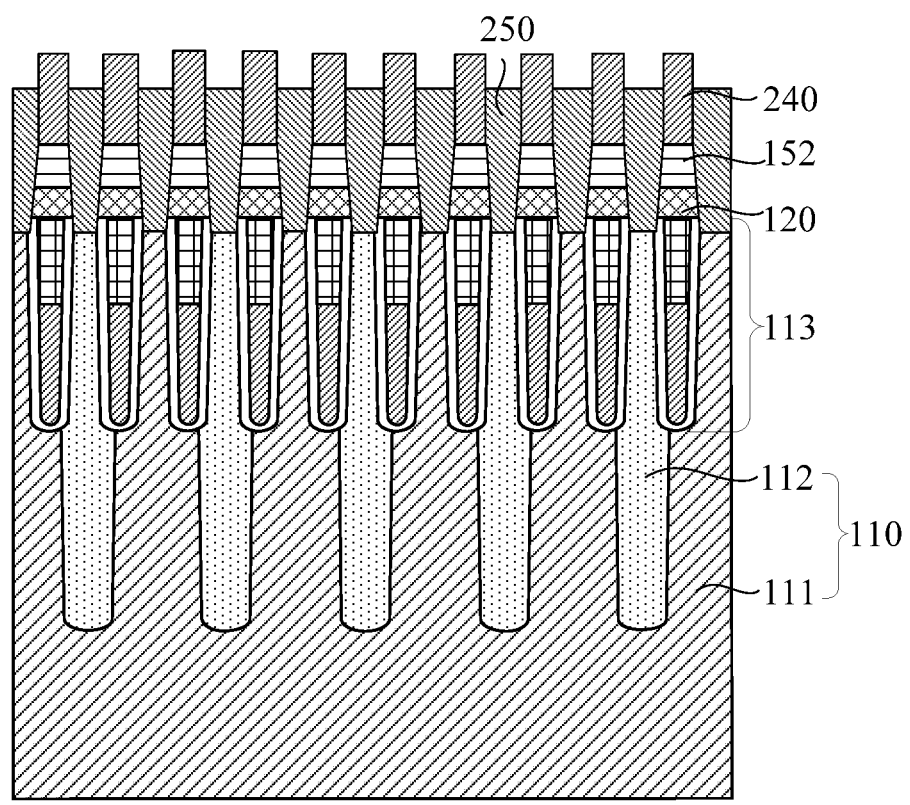
FIG. 24 is a schematic structural diagram after conductive pillars are formed in an embodiment of the disclosure.

Specifically, referring to FIG. 11, FIG. 23 and FIG. 24, forming conductive pillars 250 in the filling holes 212, in which the conductive pillars 250 are respectively electrically connected to the active areas 111, includes the following operations.

A first conductive layer 251 is deposited in the first trenches 210 and on the first supporting layers 240, in which the first conductive layer 251 is filled in the first trenches 210 and covers the first supporting layers 240, and the first conductive layer 251 is electrically connected to the active areas 111. As shown in FIG. 11 and FIG. 23, a first conductive layer 251 is filled up the first trenches 210 and covers the first supporting layers 240. The material of the first conductive layer 251 may be silicon oxide.

After the first conductive layer 251 is formed, the first conductive layer 251 is etched to retain the part of the first conductive layer 251 located in the filling holes 212, in which the retained first conductive layer 251 forms the conductive pillars 250. As shown in FIG. 11 and FIG. 24, the first conductive layer 251 located on the bit lines and the filling holes 212 is removed to retain the first conductive layer 251 located at the bottoms of the filling holes 212. The retained first conductive layer 251 is separated into a plurality of conductive layers by the first supporting layers 240 and the bit lines. The conductive pillar 250 are arranged at intervals and not connected with each other. Specifically, as shown in FIG. 24, at least the part of the first conductive layer 251 located on second supporting layers 152 of the bit lines is removed to separate the first conductive layer 251 into a plurality of conductive layers.

Figure 25:
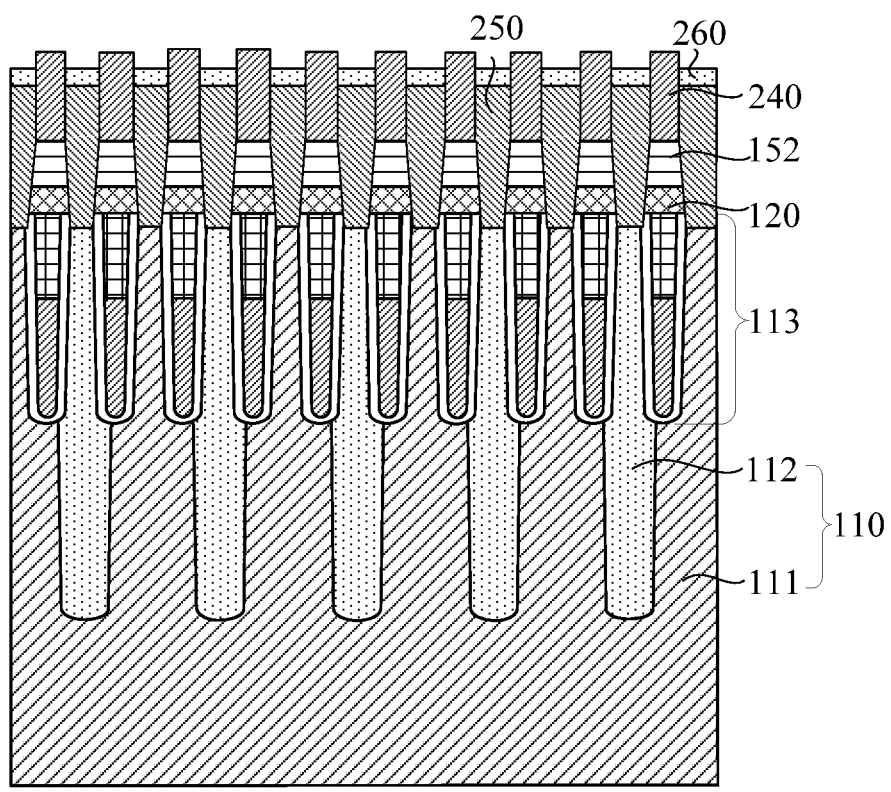
FIG. 25 is a schematic structural diagram after a first protective layer is formed in an embodiment of the disclosure.

It should be noted that, after the conductive pillars 250 are formed in the filling holes 212, in which the conductive pillars 250 are electrically connected to the active areas 111, the method further include the following operation. A protective layer 260 is deposited on each of the conductive pillars 250, in which the protective layer 260 covers the conductive pillar 250. Referring to FIG. 25, a protective layer 260 is deposited on each of the conductive pillars 250, in which the protective layer 260 covers the surface of the conductive pillar 250 away from the base 100. The material of the protective layer 260 may be a nitride, for example, silicon nitride. The thickness of the protective layer 260 is relatively small. For example, the protective layer 260 can reduce or prevent the conductive pillar 250 from being oxidized by being exposed to air.

The embodiments of the disclosure also provide a semiconductor structure, which is obtained by the above-mentioned method, and thus at least has the advantage that the loss of a bit line 150 is less. Specific effects are described above and will not be repeated here.

In this specification, examples or embodiments are described in a progressive way, and each embodiment focuses on the differences with other embodiments, and the same and similar parts of the embodiments can be referred to each other.

In the description of this specification, descriptions of the reference terms "an embodiment", "some embodiments", "exemplary embodiment", "example", "specific example", or "some examples", etc. mean that specific features, structures, materials, or features described with reference to the embodiment or example are included in at least one embodiment or example of the disclosure. In the specification, the illustrative use of the above terms does not necessarily refer to the same embodiment or example. Furthermore, the specific features, structures, materials or characteristics described may be combined in any one or more embodiments or examples in a proper manner.

Finally, it should be noted that, the above embodiments are only used to illustrate the technical solution of the disclosure, but not to limit the disclosure. Although the disclosure has been described in detail with reference to the foregoing embodiments, an ordinary person skilled in the art should understand that it is still possible to modify the technical solution described in the foregoing embodiments or to replace some or all of their technical features equivalently. However, these modifications or replacements do not make the essence of corresponding technical solution depart from the scope of the technical solution of the embodiments of the disclosure.

The invention claimed is:

1. A method for manufacturing a semiconductor structure, comprising:
    forming a spin on hard mask layer on a base, wherein a plurality of active areas arranged at intervals are provided in the base, a plurality of bit lines arranged at intervals and extending in a first direction are provided on the base, each of the bit lines is electrically connected to at least one of the active areas, and the spin on hard mask layer is filled between the bit lines and covers the bit lines;
    removing part of the spin on hard mask layer to form a plurality of first trenches arranged at intervals and extending in a second direction;
    forming first sacrificial layers in the first trenches, wherein each of the first sacrificial layers is filled in each of the first trenches;
    removing the spin on hard mask layer between the first sacrificial layers to form second trenches;
    forming first supporting layers in the second trenches, wherein each of the first supporting layers is filled in each of the second trenches; and
    removing the first sacrificial layers and elongating the first trenches located between adjacent bit lines to the active areas.

2. The method according to claim 1, wherein removing part of the spin on hard mask layer to form the plurality of first trenches arranged at intervals, wherein the first trenches expose the base, comprises:
    forming an intermediate layer and a silicon-containing anti-reflection layer stacked in sequence on the spin on hard mask layer, wherein the silicon-containing anti-reflection layer has a plurality of first grooves arranged at intervals and extending in the second direction;
    forming a second sacrificial layer on sidewalls of the first grooves, wherein the second sacrificial layer located in the first grooves defines third grooves;
    forming a first filling layer in the third grooves;
    removing the second sacrificial layer located on the sidewalls of the first grooves to form first etching grooves; and
    etching along the first etching grooves to the spin on hard mask layer to form the first trenches.

3. The method according to claim 2, wherein bottoms of first grooves are located in the silicon-containing anti-reflection layer.

4. The method according to claim 2, wherein forming the intermediate layer and the silicon-containing anti-reflection layer stacked in sequence on the spin on hard mask layer, wherein the silicon-containing anti-reflection layer has the plurality of first grooves arranged at intervals and extending in the second direction, comprises:
    forming a first mask layer, a second mask layer and a photoresist layer stacked in sequence on the silicon-containing anti-reflection layer;
    etching the second mask layer by taking the photoresist layer as a mask to form a plurality of first intermediate grooves arranged at intervals and extending in the second direction in the second mask layer;
    depositing a third sacrificial layer on sidewalls and bottoms of the first intermediate grooves, and on the second mask layer, wherein the third sacrificial layer located in the first intermediate grooves defines second intermediate grooves;
    removing the third sacrificial layer located on a top of the second mask layer and bottoms of the second intermediate grooves to retain the third sacrificial layer located on the sidewalls of the first intermediate grooves; and
    etching the second mask layer, the first mask layer and the silicon-containing anti-reflection layer by taking the retained third sacrificial layer as a mask to form the first grooves.

5. The method according to claim 4, wherein the first mask layer comprises a first foundation layer provided on the silicon-containing anti-reflection layer, and a first anti-reflection layer provided on the first foundation layer;
    the second mask layer comprises a second foundation layer provided on the first anti-reflection layer and a second anti-reflection layer provided on the second foundation layer; and
    a material of the first foundation layer is same as a material of the second foundation layer, and a material of the first anti-reflection layer is same as a material of the second anti-reflection layer.

6. The method according to claim 2, wherein forming the second sacrificial layer on the sidewalls of the first grooves, wherein the second sacrificial layer located in the first grooves defines the third grooves, comprises:
    depositing the second sacrificial layer on the sidewalls and bottoms of the first grooves and on the silicon-containing anti-reflection layer.

7. The method according to claim 6, wherein forming the first filling layer in the third grooves comprises:
    forming the first filling layer in the third grooves and on the second sacrificial layer; and
    removing part of the first filling layer and part of the second sacrificial layer to expose the second sacrificial layer located on the sidewalls of the first grooves.

8. The method according to claim 7, wherein forming the first sacrificial layers in the first trenches comprises:
depositing the first sacrificial layers in the first etching grooves and the first trenches.

9. The method according to claim 8, further comprising: after forming the first sacrificial layers in the first trenches,
removing the intermediate layer, the first sacrificial layers, and the silicon-containing anti-reflection layer located on the spin on hard mask layer to expose the spin on hard mask layer.

10. The method according to claim 1, further comprising: after removing the first sacrificial layers to expose the first trenches and elongating filling holes of the first trenches to the active areas,
forming conductive pillars in the filling holes, wherein the conductive pillars are electrically connected to the active areas.

11. The method according to claim 1, wherein the base comprises a substrate, an insulating layer disposed on the substrate, and a barrier layer disposed on the insulating layer, wherein the active areas are disposed in the substrate, and the insulating layer covers the active areas, and
wherein removing the first sacrificial layers and elongating the first trenches located between adjacent bit lines to the active areas comprises:
etching the first sacrificial layers to expose the first trenches, wherein each of the first trenches comprises a second groove located on the bit lines and extending in the second direction, and filling holes located between adjacent bit lines and in communication with the second groove; and
etching the insulating layer along the filling holes of the first trenches to expose the active areas by the filling holes.

12. The method according to claim 10, wherein forming conductive pillars in the filling holes, wherein the conductive pillars are electrically connected to the active areas, comprises:
depositing a first conductive layer in the first trenches and on the first supporting layers, wherein the first conductive layer is filled in the first trenches and covers the first supporting layers, and the first conductive layer is electrically connected to the active areas; and
etching the first conductive layer to retain part of the first conductive layer located in the filling holes, wherein the retained first conductive layer forms the conductive pillars.

13. The method according to claim 12, wherein a plurality of word lines arranged at intervals and extending in the second direction are further disposed in a substrate, and the word lines are insulated from the active areas and staggered from the conductive pillars.

14. The method according to claim 10, further comprising: after forming conductive pillars in filling holes, wherein the conductive pillars are electrically connected to the active areas,
depositing a protective layer on each of the conductive pillars, wherein the protective layer covers the conductive pillars.

15. The method according to claim 1, wherein each of the bit lines comprises a second conductive layer and a second supporting layer covering the second conductive layer, in the second supporting layer, an oxide layer is provided at a side of the second conductive layer, and a material of the second supporting layer and a material of the first supporting layer are the same,
wherein a selection ratio between the spin on hard mask layer and the second supporting layer is greater than or equal to 5.

16. The semiconductor structure obtained by the method for manufacturing the semiconductor structure according to claim 1.

* * * * *